(12) United States Patent
Choi et al.

(10) Patent No.: US 6,707,327 B2
(45) Date of Patent: *Mar. 16, 2004

(54) FREQUENCY DIVIDING CIRCUIT

(75) Inventors: Ka Lun Choi, Laguna Beach, CA (US);
Derek Hing Sang Tam, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/307,308

(22) Filed: Dec. 2, 2002

(65) Prior Publication Data

US 2003/0117187 A1 Jun. 26, 2003

Related U.S. Application Data

(63) Continuation of application No. 09/982,844, filed on Oct. 22, 2001.
(60) Provisional application No. 60/248,425, filed on Nov. 14, 2000.

(51) Int. Cl.[7] ............................................... H03K 21/00
(52) U.S. Cl. ........................ 327/115; 327/117; 377/48
(58) Field of Search ................................ 327/115, 117; 377/47, 48

(56) References Cited

U.S. PATENT DOCUMENTS 5,528,181 A  *  6/1996  Suggs ........................ 327/115
6,570,417 B2 *  5/2003  Choi et al. .................. 327/115

* cited by examiner

*Primary Examiner*—Kenneth B. Wells
(74) *Attorney, Agent, or Firm*—Sterne, Kessler, Goldstein & Fox P.L.L.C.

(57) ABSTRACT

A frequency dividing circuit divides a master clock frequency by a non-integer factor to provide an output clock signal whose frequency is equal to the frequency of the master clock signal divided by that non-integer factor. In one embodiment, the circuit is operative to divide the master clock frequency by 2.5.

10 Claims, 5 Drawing Sheets

FREQUENCY DIVIDING CIRCUIT

CROSS-REFERENCE TO RELATED APPLICATIONS

This application is a continuation of the U.S. Non-Provisional Application entitled "Frequency Dividing Circuit," Ser. No. 09/982,844, filed Oct. 22, 2001, which claims the benefit of U.S. Provisional Application No. 60/248,425, filed Nov. 14, 2000, all of which are incorporated herein in their entireties by reference.

BACKGROUND OF THE INVENTION

1. Field of the Invention

The present invention generally relates to divide-by-N circuits for dividing the frequency of a master clock signal in order to obtain a clock signal having a different frequency from that of the master clock signal (also known as frequency dividers). The present invention more particularly relates to a frequency dividing circuit that divides the frequency of a master clock signal by a non-integer.

2. Background Art

Divide-by-N counters (or circuits) are well-known circuits that are used to divide the frequency of a clock signal (e.g., a system clock) by a specific number of counts. That is, for N clock pulses input into the circuit, only one output pulse is generated.

These frequency dividers are used for many different applications. In particular, frequency dividers are used to reduce the overall number of oscillators required on a given semiconductor chip, thereby making available additional room on the chip to place as much other circuitry as possible. Often, a single oscillator circuit is provided that generates a master clock signal. One or more frequency dividers are then used to generate clock signals having different frequencies. Typically, one or more divide-by-2 circuits are used to divide the master oscillator clock frequency by a factor of 2, 4, 8, etc.

It would be desirable to provide a frequency divider that can divide a master clock signal by a non-integer factor. In addition, it would be desirable to have such a frequency divider that can be used for very high speed applications (e.g. >1 Ghz), and that provides a clock signal having very low jitter.

BRIEF SUMMARY OF THE INVENTION

According to an aspect of the invention, a frequency dividing circuit is provided that divides a master clock frequency by a noninteger factor to provide an output clock signal whose frequency is equal to the frequency of the master clock signal divided by that non-integer factor. In one embodiment, the circuit is operative to divide the master clock frequency by 2.5, but circuits that are operative to divide the master clock frequency by other non-integer factors can be designed.

In one embodiment, the circuit incorporates a conventional Johnson counter, and a plurality of stages, with the respective stages being clocked with a phase-shifted version of the master clock signal. Various OR logic operations are performed on the outputs from the different stages to achieve the divide-by-2.5 output clock signal.

Thus, in one illustrative embodiment, the invention is directed to a frequency divider that is operative to divide a master clock signal by a non-integer factor, including a plurality of flip flops, each of the flip flops being clocked with a first clock signal, and the output of each flip flop being introduced to the adjacent flip flop and to a NOR gate, with the output of the NOR gate being introduced to the first flip flop, the divider further including a plurality of stages, each being clocked by a phase-shifted version of the first clock signal, with the outputs of the stages being introduced to respective OR logic operations to arrive at the frequency divided clock signal.

In another embodiment, the invention is directed to a method of generating an output clock signal whose frequency is equal to a master clock signal frequency divided by a non-integer factor, the method including clocking the respective flip flops of a Johnson counter with the master clock signal, and providing outputs from respective ones of those flip flops to various stages, with the respective stages being clocked by phase-shifted versions of the master clock signal, and then combining the outputs from the respective stages to achieve the frequency-divided output clock signal.

In another embodiment, the invention is directed to a method of generating an output clock signal whose frequency is equal to a master clock signal frequency divided by a non-integer factor, the method including receiving a master clock signal, using the master clock signal to clock a sequential counter having multiple outputs, introducing the respective outputs from the counter to respective stages, where each stage is clocked by a phase-shifted version of the master clock signal, and combining the outputs from the respective stages to generate the frequency-divided output clock signal.

BRIEF DESCRIPTION OF THE DRAWINGS/FIGURES

These and other features, aspects and advantages of the present invention will be more fully understood when considered with respect to the following detailed description, appended claims and accompanying drawings wherein:

DETAILED DESCRIPTION OF THE INVENTION

Figure 1:
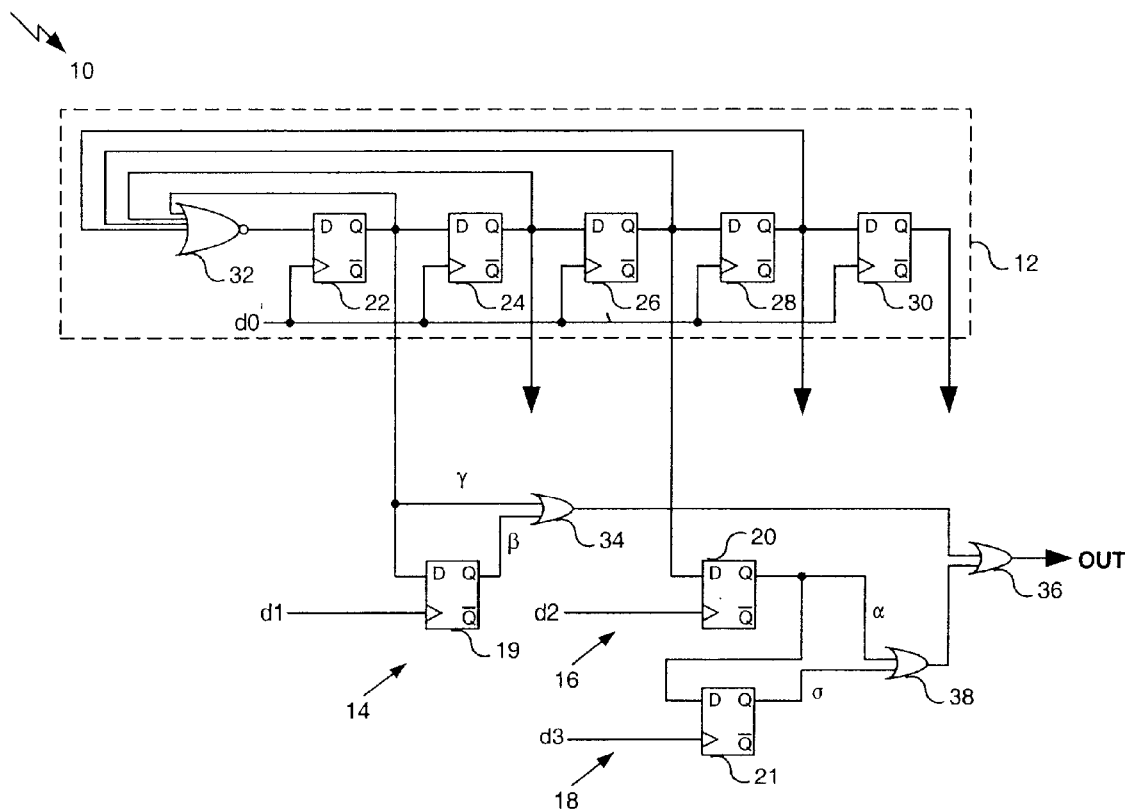
FIG. 1 is a schematic diagram of a frequency divider circuit that depicts one illustrative embodiment of the invention.
Figure 2:
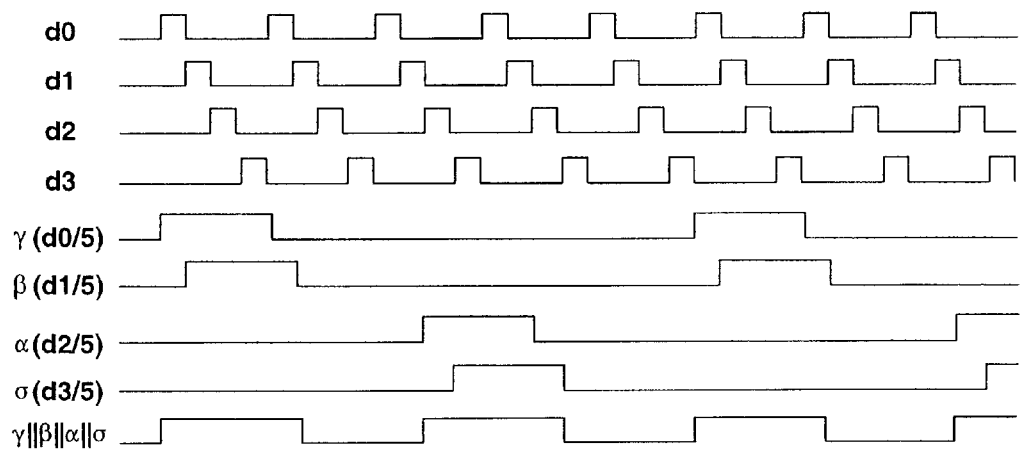
FIG. 2 is a timing diagram of the signals generated by the circuit of FIG. 1.

Referring now to FIGS. 1 and 2, one illustrative embodiment of a divide-by-2.5 circuit 10 is shown. The circuit 10 includes a Johnson counter, generally designated 12, and a plurality of stages 14, 16, and 18. Each of the stages 14, 16, and 18 includes a corresponding flip flop 19, 20, and 21, whose input is tied to the output of a flip flop from Johnson counter 12, as is described in more detail below. The various flip flops 19, 20, and 21 of stages 14, 16, and 18, and those of Johnson counter 12 are driven by various clock signals d0, d1, d2, and d3 that are all phase-shifted relative to each other.

Johnson counter 12 includes five series-connected, D flip flops 22, 24, 26, 28, and 30, as well as a NOR gate 32. The output of NOR gate 32 is introduced to the first flip flop 22. NOR gate 32 has four inputs that are connected to the respective outputs of flip flops 22, 24, 26, and 28. The output of flip flop 22, in addition to being introduced to NOR gate 32, is also introduced to the input of flip flop 24; the output of flip flop 24 is introduced to the input of flip flop 26, whose output is introduced to the input of flip flop 28, whose output is introduced to the input of flip flop 30.

Each of flip flops 22 through 30 are clocked by a clock signal d0. Preferably, clock signal d0 is the master system clock from which the frequency-divided signal is to be obtained. As is shown in FIG. 2, when the output of NOR gate 32 is high (i.e., a digital "1"), the output γ of flip flop 22 goes high upon the next rising edge pulse from master clock d0 (FIG. 2). The output of NOR gate 32 is high only when all four inputs to it are low (digital "0").

The output γ of flip flop 22 is introduced to the input of NOR gate 32, such that when that output goes high, it causes the output of NOR gate 32 to go low (a digital "0"), such that when flip flop 22 is again clocked by clock signal d0 (the second clock signal from clock d0 as shown in FIG. 2), its output goes low as well (FIG. 2).

The output γ of flip flop 22 is also introduced to flip flop 24, such that when the output γ is high, the output of flip flop 24 will in turn go high upon receipt of the next clock pulse from clock signal d0 (the second clock pulse shown in FIG. 2). The output of flip flop 24 is introduced to NOR gate 32 and to flip flop 26. This ensures that the output of NOR gate 32 remains low, since the output γ of flip flop 22 being introduced to NOR gate 32 is now low. Likewise, the output of flip flop 26 goes high upon receipt of the next clock pulse from clock signal d0, which in turn causes the output of flip flop 28 to go high upon receipt of the next clock pulse.

Thus, the output of NOR gate 32 is only high when all outputs of flip flops 22 through 30 are low. The next clock pulse received by the respective flip flops 22 through 30 (hereinafter "the first clock pulse") causes the output of flip flop 22 to go high. The output of NOR gate then goes low and remains low when the subsequent four clock pulses (hereinafter the "second", "third", "fourth", and "fifth clock pulses") are received, because an output from a respective one of the flip flops 22 through 28 is high during each of those clock pulses. The sixth clock pulse then causes the output of flip flop 22 to once again go high and restarts the process (FIG. 2). Therefore, it will be understood that the respective outputs from flip flops 22 through 30 go high in a sequential manner upon being clocked by successive ones of the clock pulses from master clock signal d0.

The output γ of flip flop 22 is further introduced to flip flop 19 of stage 14, and is also introduced to a two-input OR gate 34. The other input of OR gate 34 is the output β of-flip flop 19.

Flip flop 19 is clocked by a clock signal d1 that is phase-shifted 90 degrees from clock signal d0 (see FIG. 2). Thus, the output β of flip flop 19 has a 90 degree lag from the output γ of flip flop 22 (i.e., β is generated by re-timing γ by d1). The output of OR gate 34 is high when either γ or β is high (FIG. 2). The output of OR gate 34 is introduced to another OR gate 36, whose output is the output lock signal of circuit 10. Thus, the output of OR gate 36 (shown as the last signal line in FIG. 2) includes a pulse signal that is high when either γ or β is high.

The output of flip flop 26 is introduced to flip flop 20 of stage 16. Flip flop 20 is clocked by a clock signal d2 that is phase shifted 180 degrees from clock signal d0, and 90 degrees from clock signal d1 (FIG. 2). Thus, when the third clock pulse from clock signal d0 is received by flip flops 22 through 30, the input to flip flop 20 goes high. The output a of flip flop 20 then goes high 180 degrees (or ½ of a period) later, and is introduced to an OR gate 38 and to flip flop 21 of stage 18. The output of OR gate 38 is introduced to OR gate 36.

Flip flop 21 of stage 18 is clocked by a clock signal d3, which is phase shifted 270 degrees from clock signal d0. Thus, when the output a of flip flop 20 of stage 16 goes high, the output σ of flip flop 21 of stage 18 goes high but with a 90 degree lag (FIG. 2). The output σ of flip flop 21 is introduced to OR gate 38. Thus, the output of OR gate 38 is high when either α or σ is high (FIG. 2). The output of OR gate 38 is introduced to OR gate 36, such that the output of OR gate 36 includes a pulse signal that is high when either α or σ is high.

Thus, as shown in FIG. 2, the output of OR gate 36 (the last signal line in the figure) has a frequency that is equal to that of the master clock signal d0 divided by 2.5.

Clock signals d0, d1, d2, and d3, in the illustrative embodiment, correspond to clock phases of 0, 90, 180, and 270 degrees, respectively. However, it will be understood that the phases can be varied to vary the frequency of the output clock signal of circuit 10. Thus, the fact that the respective clock signals are phase-shifted by 90 degrees is not crucial; the crucial aspect of the invention is providing phase-shifted versions of the clock signal d0 to the respective stages to generate the output clock signal that is divided by a non-integer.

In one embodiment, the respective phase-shifted clock signals are generated by a multi-phase, voltage controlled oscillator (VCO), which generates a multi-phase clock signal. The respective phase-shifted clock signals d0, d1, d2, and d3 can be taken from such a multi-phase clock signal, as will be understood by those having ordinary skill in the art.

While the circuit 10 in one illustrative embodiment includes stage 14, it will be understood that stage 14 and OR gate 34 can be removed and circuit 10 may still generate a divide-by-2.5 clock signal. In that situation, the output γ may be introduced directly to OR gate 36. In addition, the output α of stage 16 may be introduced directly to OR gate 36 as well, and stage 18 and OR gate 38 may be removed. The pulse widths of the output clock signal will be shortened by ¼ of a period, but the rising edges of the output clock pulses are generated at the identical time as that shown in FIG. 2. Furthermore, the last flip flop 30 in counter 12 may also be removed from circuit 10 while still generating the divide-by-2.5 output signal.

In addition, while circuit 10 is designed to divide the frequency of master clock signal d0 by a factor of 2.5, it will be readily understood by those having ordinary skill in the art that by adjusting the phases of the respective clock signal d1, d2, and d3, and/or by connecting the respective stages 14, 16, and 18 to different ones of flip flops 22 through 30, the circuit 10 may provide an output clock signal that is divided by some other noninteger factor, such as 1.5, 3.5, and the like.

For example, in order to generate a divide-by-3.5 circuit, counter 12 is modified to include a six-input NOR gate and six flip flops, with the output of each flip flop serving as an input to the NOR gate. In addition, the input to stage 16 is modified to be connected to the output of the fourth flip flop in the series, rather than the third. Such a construction results in a circuit whose output is the frequency of the input clock signal divided by 3.5.

Figure 3:
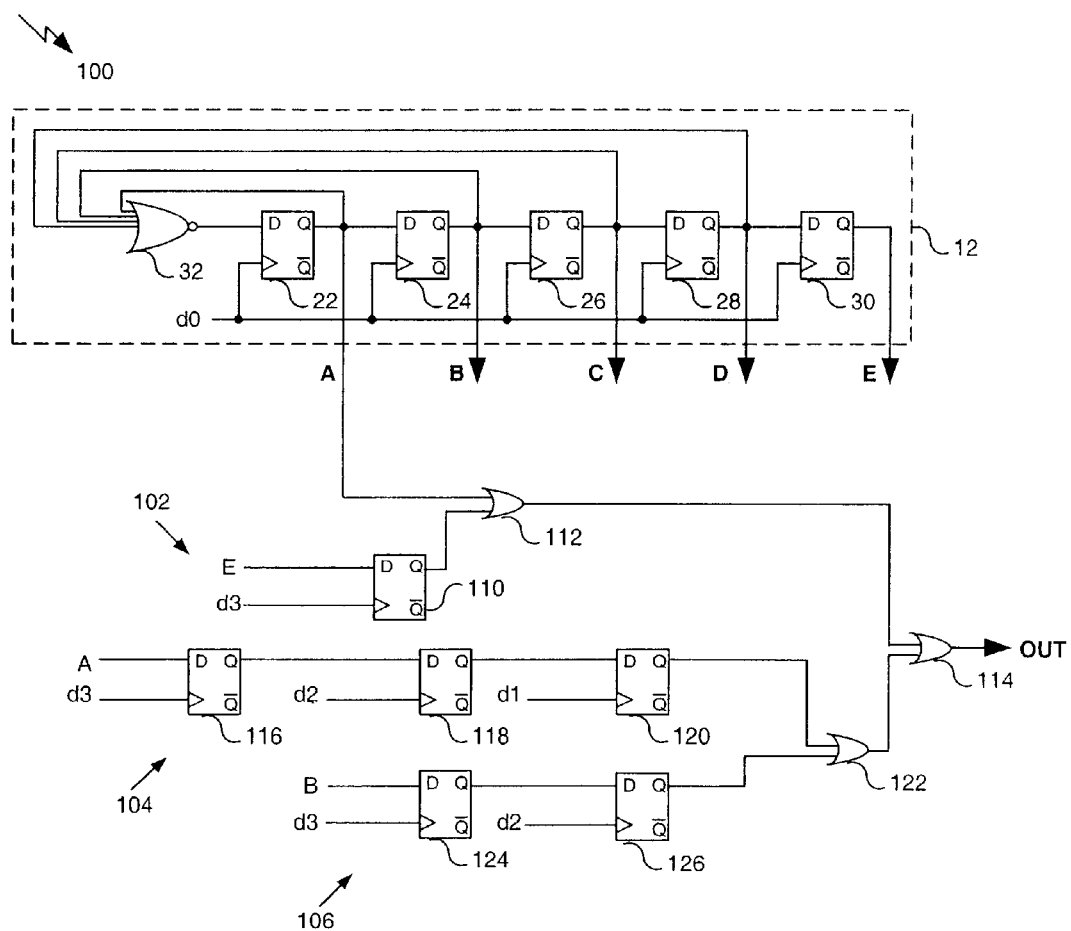
FIG. 3 is a schematic diagram of an illustrative embodiment of a high-speed frequency divider circuit according to the present invention.

Referring now to FIG. 3, there is shown another illustrative embodiment of a divide-by-2.5 circuit 100 according to the present invention. Circuit 100 utilizes the identical Johnson counter 12 from FIG. 1, including flip flops 22 through 30 and NOR gate 32, with each flip flop being clocked by master clock signal do. Each flip flop 22 through 30 provides a corresponding output signal A, B, C, D, and E. Circuit 100 also includes three stages 102, 104, and 106, similar to circuit 10; however, stages 104 and 106 each include plural series-connected flip flops that provide a maximum set-up time for the respective flip flops.

Stage 102 includes flip flop 110, which is clocked by 270 degree lag clock signal d3, and whose input is output signal E from flip flop 30. The output of flip flop 110 is introduced to OR gate 112, along with output signal A from flip flop 22. The output of OR gate 112 is introduced to OR gate 114, whose output is the frequency-divided, output clock signal.

Because flip flop 110 is clocked with clock signal d3 rather than with clock signal d1, the re-timing operation is performed toward the end of the positive cycle of output signal E (d3E/5 Of FIG. 4) rather than at the beginning of the positive cycle. This provides a maximum setup time for flip flop 110. As is well known in the art, D flip flops have a setup time window during which the D input to the flip flop cannot change. This window occurs around the triggering edge of the clock signal. Thus, by providing the clock signal toward the end of the positive cycle, potential problems (e.g., unstable or unpredictable states) are overcome. This results in circuit 100 being applicable for very high-speed applications (e.g., greater than 1 gigahertz frequencies).

Stage 104 includes three series-connected flip flops 116, 118, and 120. The first flip flop 116 receives output signal A from flip flop 22, and is also clocked by 270 degree phase-shifted clock signal d3. The output of flip flop 116 is introduced to flip flop 118, which is clocked by clock signal d2 (which is phase-shifted 270 degrees from the clock signal d3). The output of flip flop 118 is introduced to flip flop 120, which is clocked by clock signal d1 (which is likewise phase-shifted 270 degrees from clock signal d2) The output of flip flop 120 is introduced to an OR gate 122, whose output is introduced to OR gate 114.

Stage 106 includes two series-connected flip flops 124 and 126. Flip flop 124 receives output signal B from flip flop 24, and is clocked by clock signal d3. The output of flip flop 124 is introduced to flip flop 126, which is clocked by clock signal d2. The output of flip flop 126 is introduced to OR gate 122.

Figure 4:
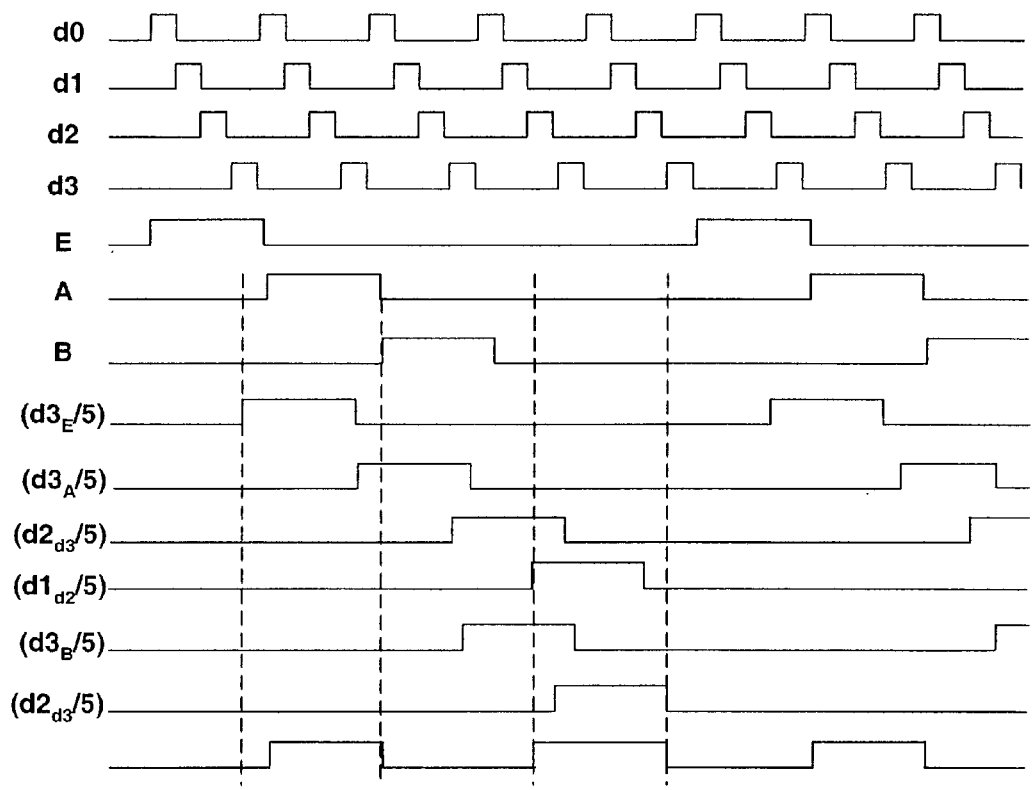
FIG. 4 is a timing diagram of the signals generated by the circuit of FIG. 3.

Thus, as is shown in more detail in FIG. 4, the re-timing operations at each flip flop of the respective stages 102, 104, and 106 are performed at the end of the positive cycle of the corresponding signals that are introduced to the respective flip flops. This provides each flip flop with a maximum set-up time, to ensure reliable high-speed operation of circuit 100.

Figure 5:
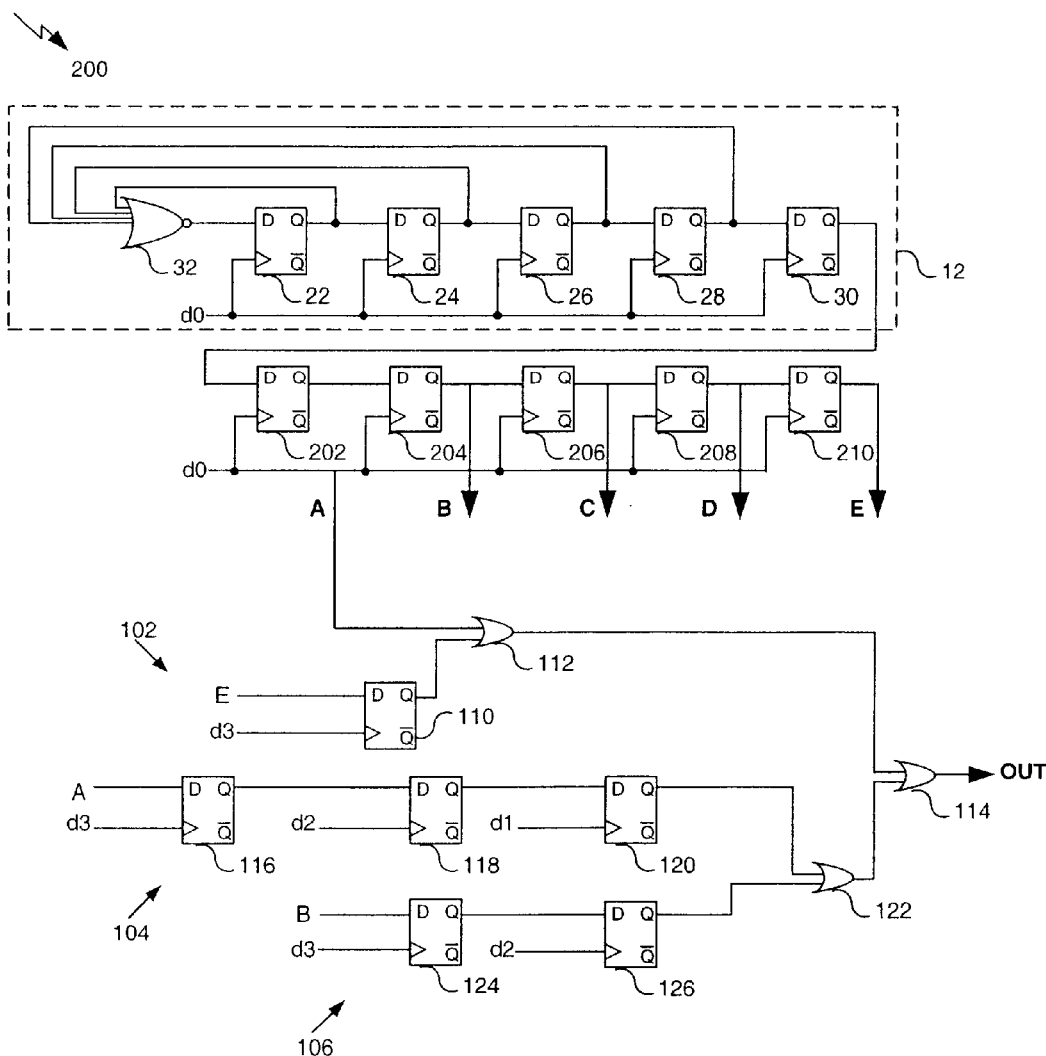
FIG. 5 is a schematic diagram of another illustrative embodiment of a high speed frequency divider circuit according to the present invention.

Referring now to FIG. 5, there is shown a circuit 200 according to yet another embodiment of the present invention. Circuit 200 is similar to circuit 100, and includes Johnson counter 12 and the respective stages 102, 104, and 106, and OR gates 112, 114, and 122. In addition, circuit 200 includes an additional chain of series-connected flip flops 202 through 210. Each flip flop 202 through 210 is clocked by clock signal d0, as are flip flops 22 through 30. The input to flip flop 202 is connected to the output of flip flop 30. Thus, flip flops 22 through 30 and 202 through 210 define a series of ten (10) flip flops. The outputs of flip flops 202 through 210 are the output signals A through E that are used to drive the respective flip flops of stages 102, 104, and 106, similar to circuit 100.

By providing the additional chain of flip flops 202 through 210, and decoupling those flip flops from Johnson counter 12, the loading on the respective feedback inputs to the NOR gate 32 of Johnson counter 12 is minimized, which enhances the operating speed of the loop.

While the various embodiments of the present invention are shown and described as including D flip flops, it will be apparent to those skilled in the art that other types of flip flops (e.g., S-R or J-K flip flops), or latches may be used in place of the D flip flops. In addition, the D flip flops may be either positive or negative-edge triggered flip flops.

In addition, while the invention utilizes a Johnson counter, it will be understood that any suitable counter may be used to provide the respective output signals to the various stages.

From the foregoing, it will be apparent to those skilled in the art that the present invention provides a circuit for dividing the frequency of a clock signal by a non-integer. In addition, the circuit is designed for high speed applications, and provides very low jitter division on a high speed clock input.

While the above description contains many specific features of the invention, these should not be construed as limitations on the scope of the invention, but rather as exemplary embodiments thereof. Many other variations are possible. Accordingly, the scope of the invention should be determined not by the embodiments illustrated, but by the appended claims and their legal equivalents.

What is claimed is:

1. A dividing circuit comprising:
   a first group of bistable devices, each device being configured to produce a first output signal in response to a received master clock signal; and
   a plurality of circuit stages, each stage including at least one bistable device from a second group of bistable devices and being coupled, at least indirectly, to one or more output ports of the devices of the first group, the plurality of stages being configured to produce a second output signal;
   wherein each stage is configured to receive as an input a respective slaved clock signal, each respective slaved clock signal having characteristics different from characteristics of the master clock signal; and
   wherein the second output signal has a frequency substantially equal to a frequency of the master clock signal divided by a non-integer factor.

2. The dividing circuit of claim 1, wherein the characteristics include phase.

3. The dividing circuit of claim 2, further comprising a logic gate; wherein the logic gate and the first group of bistable devices form a synchronous counter.

4. The dividing circuit of claim 3, wherein the synchronous counter is a Johnson counter.

5. The dividing circuit of claim 1, wherein the bistable devices are flip-flops.

6. The dividing circuit of claim 5, wherein the master output signal is successively provided as an input to each of the flip-flops.

7. The dividing circuit of claim 1, further comprising a multi-phase voltage control oscillator configured to generate all of the clock signals.

8. The dividing circuit of claim 7, wherein the multi-phase voltage control oscillator generates the first output signal and each of the respective slaved clock signals;
   wherein the master clock signal and each of the respective slaved clock signals are derived from multi-phase clock signal; and wherein the master clock signal and each of the respective slaved clock signals are shifted in phase relative to one another.

9. A dividing circuit comprising:

a first circuit portion including a synchronous counter configured to receive a first clock signal as an input and produce an output signal in response thereto; and at least a second circuit portion including a plurality of circuit stages, each stage being configured to receive a respective clock signal, each respective clock signal having characteristics different from the first clock signal, the second circuit portion (i) being electrically connected to the first circuit portion, (ii) being configured to receive the output signal therefrom, and (iii) produce an output clock signal having a frequency numerically related to a frequency of the first clock signal;

wherein each of the plurality of circuit stages includes at least one bistable device.

10. The circuit of claim 9, wherein the first clock signal is a master clock signal;

wherein the respective clock signals are slave clock signals; and wherein the numerically related frequency is equal to a frequency of the master clock signal divided by a non-integer factor.

* * * * *